United States Patent
Yao et al.

(10) Patent No.: US 8,492,177 B2
(45) Date of Patent: Jul. 23, 2013

(54) METHODS FOR QUANTITATIVE MEASUREMENT OF A PLASMA IMMERSION PROCESS

(75) Inventors: Daping Yao, Portland, OR (US); Peter I. Porshnev, Poway, CA (US); Martin A. Hilkene, Gilroy, CA (US); Matthew D. Scotney-Castle, Morgan Hill, CA (US); Manoj Vellaikal, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 32 days.

(21) Appl. No.: 13/307,319

(22) Filed: Nov. 30, 2011

(65) Prior Publication Data

US 2013/0137197 A1    May 30, 2013

(51) Int. Cl.
  *H01L 21/66* (2006.01)
(52) U.S. Cl.
  CPC .................................. *H01L 22/12* (2013.01)
  USPC ........................................................... 438/16
(58) Field of Classification Search
  None
  See application file for complete search history.

(56) References Cited

U.S. PATENT DOCUMENTS

| | | |
|---|---|---|
| 6,151,119 A | 11/2000 | Campion et al. |
| 6,462,817 B1 | 10/2002 | Strocchia-Rivera |
| 6,553,332 B2 | 4/2003 | Leng |
| 6,950,190 B2 * | 9/2005 | Smith .......................... 356/446 |
| 2002/0173084 A1 | 11/2002 | Ohkawa |
| 2008/0093639 A1 | 4/2008 | Kim |
| 2009/0035878 A1 | 2/2009 | Sasaki et al. |
| 2009/0233384 A1 | 9/2009 | Foad et al. |

FOREIGN PATENT DOCUMENTS

KR    10-0137817 B1    6/1998

OTHER PUBLICATIONS

International Search Report and Written Opinion mailed Mar. 27, 2013 for PCT Application No. PCT/US2012/066534.

* cited by examiner

*Primary Examiner* — Scott B Geyer
(74) *Attorney, Agent, or Firm* — Moser Taboada; Alan Taboada

(57) ABSTRACT

Methods for quantitatively measuring the performance of a plasma immersion process are provided herein. In some embodiments, a method of quantitatively measuring the performance of a plasma immersion process, using a first substrate comprising an oxide layer deposited atop a silicon layer, may include subjecting the first substrate to a plasma immersion process in a first plasma immersion chamber to form a doped oxide layer atop the first substrate; and determining a thickness of the doped oxide layer by shining a beam of light upon a reflective surface of the doped oxide layer; detecting reflected beams of light off of the reflective surface of the doped oxide layer; and analyzing the reflected beams of light to determine the thickness of the doped oxide layer on the first substrate.

18 Claims, 4 Drawing Sheets

METHODS FOR QUANTITATIVE MEASUREMENT OF A PLASMA IMMERSION PROCESS

FIELD

Embodiments of the present invention generally relate to the field of plasma enhanced semiconductor manufacturing processes.

BACKGROUND

Plasma ion immersion is a standard technique in a semiconductor manufacturing process to introduce dopant elements into a substrate, such as a semiconductor wafer. One method of quantitatively measuring the performance of a plasma ion immersion process is to use Secondary Ion Mass Spectrometry (SIMS). While conventional SIMS can measure dopant and impurity concentrations in depth on a substrate, the inventors believe that the process may not be sufficiently sensitive to determine whether a plasma ion immersion process meets process control parameters. Another method of quantitatively measuring the performance of a plasma ion immersion process is to measure the post-anneal resistivity change of the conductive dopant elements. However, for plasma immersion of non-conductive dopants, such as carbon, there is no direct quantitative method of measuring the performance of the plasma ion implantation process.

Accordingly, the inventors have provided improved methods for quantitatively measuring the performance of a plasma immersion process.

SUMMARY

Methods for quantitatively measuring the performance of a plasma immersion process are provided herein. In some embodiments, a method of quantitatively measuring the performance of a plasma immersion process, using a first substrate comprising an oxide layer deposited atop a silicon layer, may include subjecting the first substrate to a plasma immersion process in a first plasma immersion chamber to form a doped oxide layer atop the first substrate; and determining a thickness of the doped oxide layer by shining a beam of light upon a reflective surface of the doped oxide layer; detecting reflected beams of light off of the reflective surface of the doped oxide layer; and analyzing the reflected beams of light to determine the thickness of the doped oxide layer on the first substrate.

In some embodiments, a method of quantitatively measuring the performance of a plasma immersion process may include subjecting a first substrate comprising an oxide layer deposited atop a silicon layer to a first plasma immersion process to form a first doped oxide layer atop the first substrate; determining a thickness of the first doped oxide layer by analyzing light reflected off of a surface of the first substrate; subjecting a second substrate comprising an oxide layer deposited atop a silicon layer to a second plasma immersion process to form a second doped oxide layer atop the second substrate; determining a thickness of the second doped oxide layer by analyzing light reflected off of a surface of the first substrate; and comparing the thicknesses of the first and second doped oxide layers to compare the results of the first and second plasma immersion processes.

In some embodiments, a method of quantitatively measuring the performance of a plasma immersion process may include determining a thickness of a first doped oxide layer of a first substrate subjected to a first plasma immersion process that formed the first doped oxide layer atop the first substrate by analyzing light reflected off of a surface of the first substrate; determining a thickness of a second doped oxide layer of a second substrate subjected to a second plasma immersion process that formed the second doped oxide layer atop the second substrate by analyzing light reflected off of a surface of the second substrate; and comparing the thicknesses of the first and second doped oxide layers to compare the results of the first and second plasma immersion processes.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
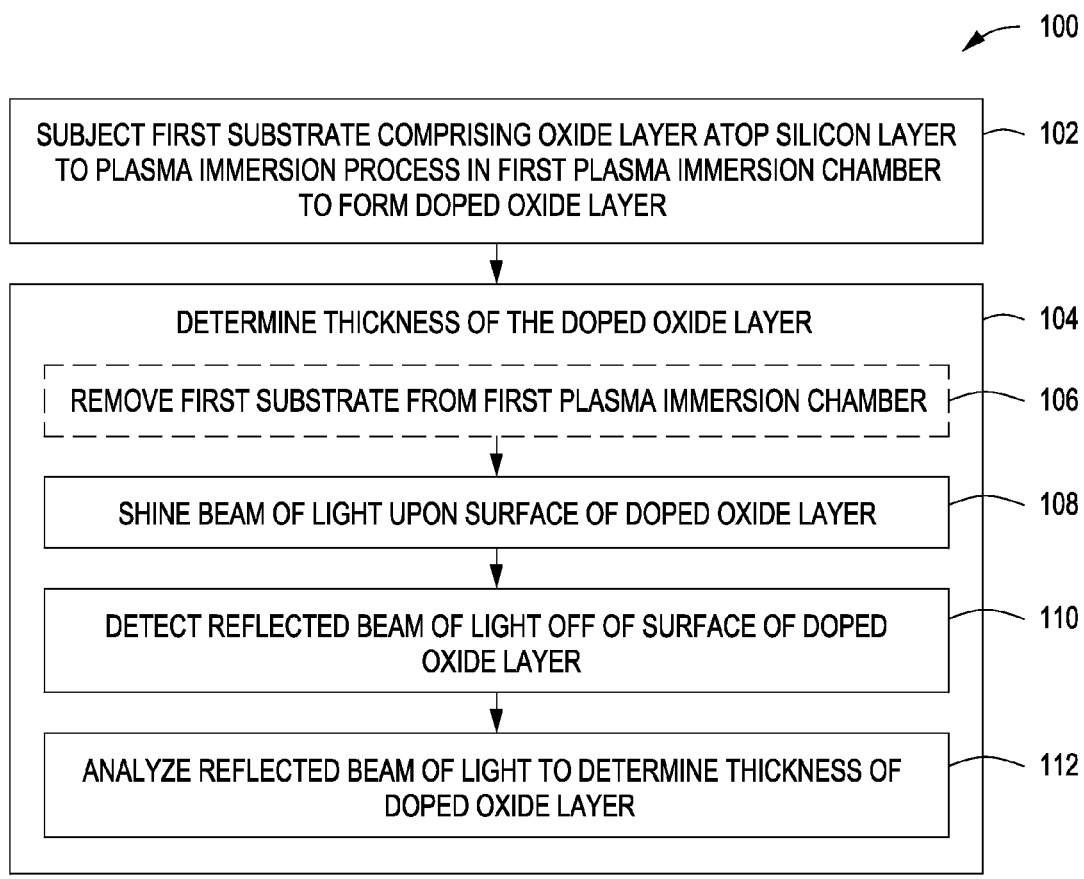
FIG. 1 depicts a flow chart for a method of quantitatively measuring the performance of a plasma immersion process in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide improved methods for quantitatively measuring the performance of a plasma immersion process. Embodiments of the present invention advantageously provide for direct measurement of a plasma immersion process that is reliable enough to determine whether the process is within control limits. In contrast to the conventionally used SIMS profile technique, embodiments of the present invention are further advantageously non-destructive.

FIG. 1 depicts a method 100 for quantitatively measuring the performance of a plasma immersion process in accordance with some embodiments of the present invention. The method 100 begins at 102 where a first substrate is subjected to a plasma immersion process within a first plasma immersion chamber. The first substrate may be used as a test substrate to analyze processing, as discussed in more detail below.

The first substrate may comprise any suitable material used in the fabrication of semiconductor devices. For example, in some embodiments, the first substrate may comprise a semiconducting material and/or combinations of semiconducting materials and non-semiconductive materials for forming semiconductor structures and/or devices. For example, the first substrate may comprise one or more silicon-containing materials such as crystalline silicon (e.g., Si<100> or Si<111>), strained silicon, polysilicon, germanium, silicon germanium, or the like. The first substrate may further have any desired geometry, such as a 200 or 300 mm wafer, square or rectangular panels, or the like. In some embodiments, the first substrate may be a semiconductor wafer (e.g., a 200 mm, 300 mm, or the like silicon wafer).

Figure 2A:
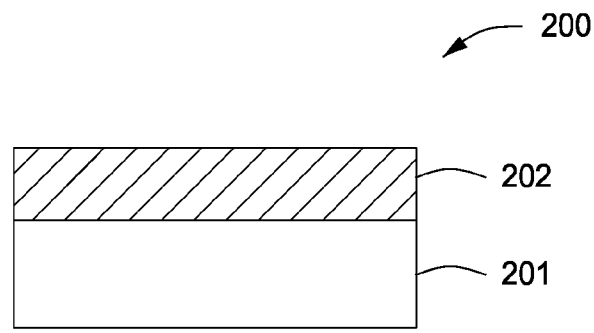
FIGS. 2A-2B depict schematic side views of a substrate during various stages of processing in accordance with some embodiments of the present invention.

As depicted in FIG. 2A, the first substrate 200 generally comprises an oxide layer 202 deposited onto a silicon layer 201 prior to subjecting the first substrate 200 to the plasma immersion process. In some embodiments, the oxide layer 202 may consist essentially of silicon and oxygen. In some embodiments, the oxide layer 202 may comprise a doped silicon oxide layer. The oxide layer may be formed or deposited on the silicon layer of the substrate in any suitable manner. For example, in some embodiments, the oxide layer 202 may be deposited on the silicon layer 201 in a low pressure chemical vapor deposition (LPCVD) chamber. In some embodiments, the oxide layer 202 is deposited while process pressure in the LPCVD chamber is maintained at about 125 Torr. In some embodiments, the process gases used to deposit the oxide layer 202 comprise $Si_2H_6$ and $N_2O$ diluted in $N_2$. In some embodiments, the oxide layer 202 may have a thickness of about 5 to about 40 nm.

Following the formation of the oxide layer 202, the first substrate 200 is subjected to a plasma immersion process involving a hydride of a dopant species to be implanted, resulting in the formation of a doped oxide layer 204. Examples of suitable dopant species include boron (B), arsenic (As), phosphorus (P), carbon (C), nitrogen (N), germanium (Ge), or the like. Hydrides of these dopant species include $B_2H_6$, $BH_3$, $AsH_3$, $PH_3$, $CH_4$, $NH_3$, $GeH_4$, $Ge_2H_6$, or the like. The plasma immersion process may be performed within a plasma immersion chamber. In some embodiments, the doped oxide layer is SiOCH.

The doped oxide layer 204 may be formed in any suitable plasma immersion chamber, such as a plasma immersion ion implantation process chamber, for example, the CONFORMA™ process chamber, available from Applied Materials, Inc., of Santa Clara, Calif. One such suitable plasma immersion chamber is described below with respect to FIG. 4. Although specific process chambers may be provided herein to illustrate embodiments of the invention, other suitable process chambers may also be used, including process chambers from other manufacturers.

Figure 2B:
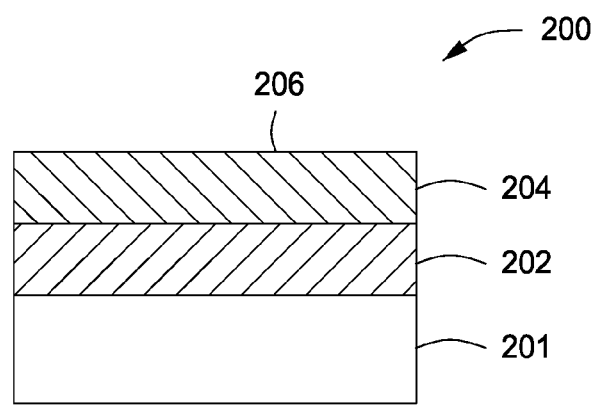
Figure 3:
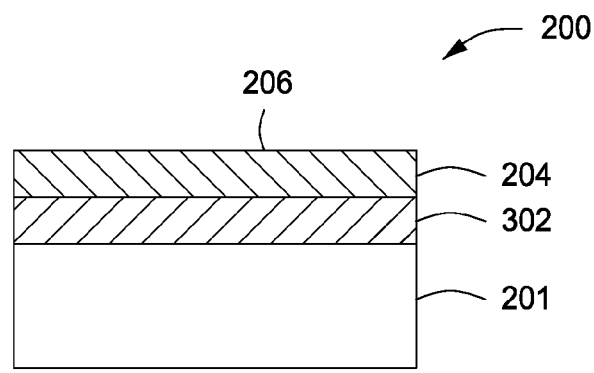
FIG. 3 depicts a schematic side view of a substrate in a particular stage of processing in accordance with some embodiments of the present invention.

In some embodiments, the doped oxide layer 204 has a thickness that is less than the thickness of the oxide layer 202, resulting in a doped oxide layer 204 that is disposed atop the remainder of the oxide layer 202, as depicted in FIG. 2B. In some embodiments, the doped oxide layer 204 has a thickness that is greater than the thickness of the oxide layer 202. In such embodiments, the plasma immersion process causes the silicon in the silicon layer 201 to amorphize, resulting in a doped oxide layer 204 that is disposed atop an amorphous silicon layer 302 formed in an upper regions of the silicon layer 201, as depicted in FIG. 3. In embodiments, the amorphous silicon layer 302 comprises, or consists essentially of, SiCH. In some embodiments, the thickness and uniformity of the doped oxide layer 204 can be used to quantitatively measure the performance of the plasma immersion process as described below.

Figure 5:
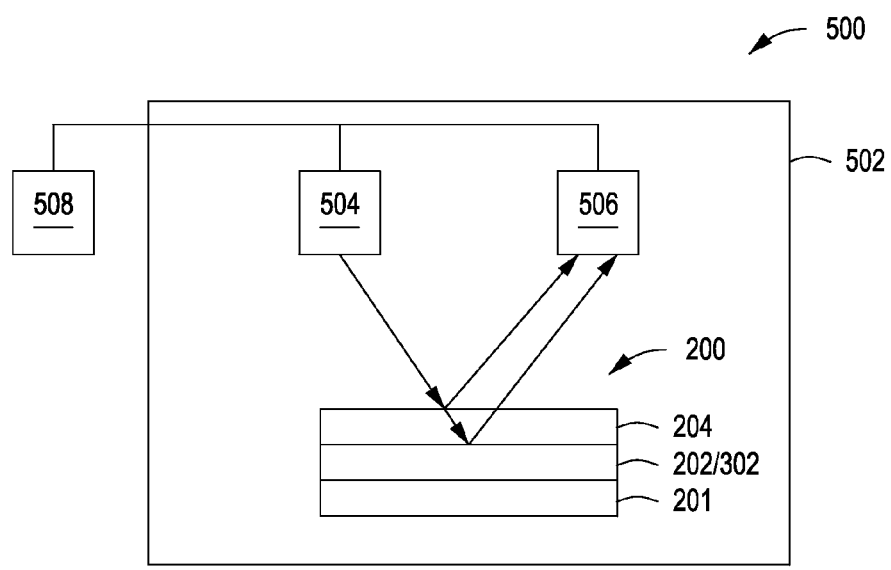
FIG. 5 depicts a layer thickness measurement chamber in accordance with some embodiments of the present invention.

For example, at 104, the thickness of the doped oxide layer may be determined in a suitable process chamber. For example, optionally, the first substrate 200 may be removed from the first plasma immersion chamber, as indicated at 106, and placed in a layer thickness measurement chamber (such as described below with respect to FIG. 5). Alternatively, if so equipped, the layer measurement may take place in the first plasma immersion chamber. FIG. 5 depicts a system 500 suitable for determining the thickness of a layer in accordance with some embodiments of the present invention. The system 500 includes a layer thickness measurement chamber 502 coupled to a controller 508. The layer thickness measurement chamber 502 may comprise any suitable chamber and may be the first plasma immersion chamber, or may be a different chamber. The layer thickness measurement chamber 502 generally requires a substrate support (not shown) for supporting the substrate 200 in a desired position to reflect a beam of light provided by a light source 504 off of the surface of the substrate 200 such that a light detector 506 can detect the reflected beam of light. The controller 508 is coupled to the light source 504 and the light detector 506 and receives data from the light detector 506 from which the thickness of the doped oxide layer on the substrate can be determined.

Returning to FIG. 1, at 108, a beam of light is shone upon a reflective surface of the doped oxide layer. The beam of light is shone from a light source disposed above the first substrate 200, such as the light source 504 depicted in FIG. 5. The light source 504 may comprise any suitable light source for providing a focused beam of light that may be directed towards and may reflect off of the reflective surface of the doped oxide layer 204. In some embodiments, the light source 504 may comprise a laser, one or more light-emitting diodes (LED), or the like. It is contemplated that the light source may comprise other components (e.g., light producing elements, light collimating elements, mirrors, or the like) that may be capable of forming and directing a beam of light.

Next, at 110, the beam of light reflected off of the reflective surface of the doped oxide layer 204 is detected. The reflected beam of light may be detected by a light sensor positioned to receive the reflected beam of light, such as the light detector 506 depicted in FIG. 5. In some embodiments, the light sensor may comprise any suitable sensor for detecting the reflected beam of light, such as a photodiode, or the like.

At 112, the detected reflected beam of light is analyzed to determine the thickness of the doped oxide layer 204 of the first substrate 200, for example by the controller 508 depicted in FIG. 5. The controller 508 may be any suitable process controller or computer and may be the process controller of the plasma immersion chamber, a process controller dedicated to the layer thickness measurement chamber 502, or some other suitable controller.

The film thickness may be determined using traditional optical techniques based upon the reflected beams of light. Specifically, the inventors have observed that the plasma immersion of hydrides into silicon substrates normally result in a very hazy surface because the deposition from the hydrides on the surface and that slight changes in the process parameters result in very significant shift in silicon surface reflection. The inventors have observed that this problem makes quantitative measurement of the plasma immersion process very difficult, if not impossible. However, the inventors have discovered that there is a large selectivity difference in hydride deposition on silicon and oxide layers. The inventors have discovered that by using a silicon oxide film as a plasma immersion test substrate results in a haze level change in the silicon oxide layer that is significantly less than that in silicon, thereby enabling a traditional optical spectrum to distinguish the concentration and depth changes of the dopants in the oxide layer. The inventors have further discovered that there is an excellent optical signal for any amorphous silicon layer that may form underneath the oxide film when the dopants are implanted to a greater thickness than the oxide layer, thereby relieving any need to have a specific requirement on the thickness of the oxide layer.

In some embodiments, the reflective surface 206 is the surface of the doped oxide layer 204. In some embodiments, the difference between the doped oxide layer 204 and the oxide layer 202 allows for a measurement of the thickness and uniformity of the doped oxide layer 204, as well as the measurement of the thickness and uniformity of the oxide layer 202. In some embodiments, the thickness and uniformity of the oxide layer 202 may be measured following the deposition of the oxide layer 202 and prior to formation of the doped oxide layer 204. In some embodiments, the difference between the doped oxide layer 204 and the amorphous silicon layer 302 allows for a measurement of the thickness and uniformity of the doped oxide layer 204 as well as the amorphous silicon layer 302.

The inventors have observed that changes in thickness and uniformity of the plasma immersion process are directly related to the process conditions. Thus, the results of the above measurement can then be quantitatively evaluated and controlled. The thickness and uniformity values can then be used to evaluate and compare from chamber to chamber and day to day by the current measurement method.

Figure 6:
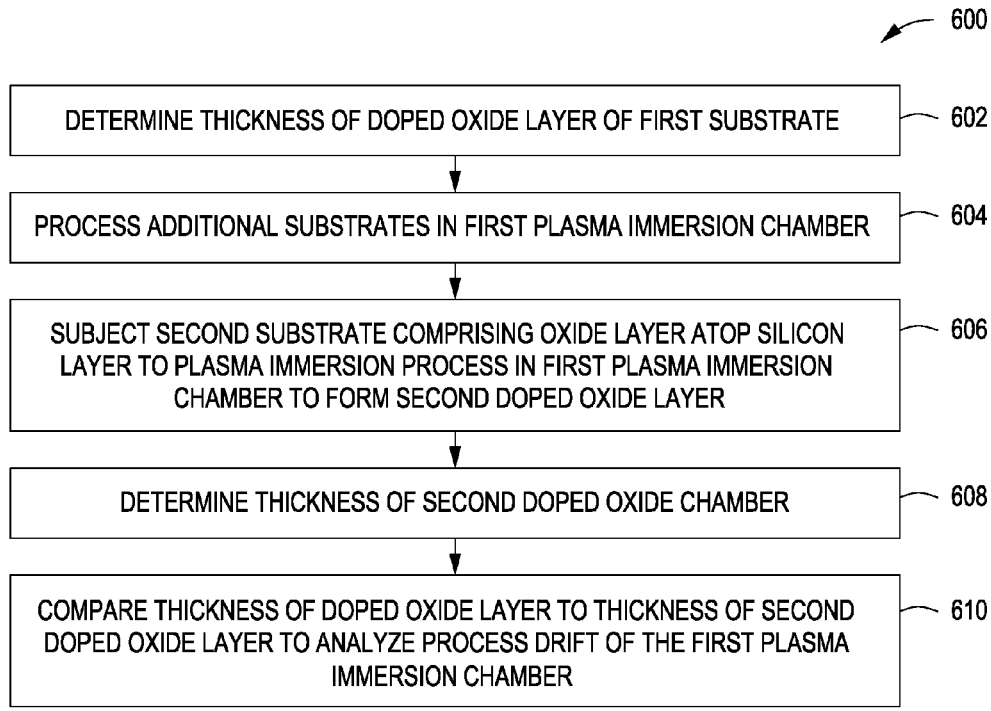
FIG. 6 depicts a flow chart for a method of quantitatively measuring the performance of a plasma immersion process in accordance with some embodiments of the present invention.

For example, in some embodiments, a plurality of substrates may be processed in the same first plasma immersion chamber. FIG. 6 depicts a flow chart for a method of quantitatively measuring the performance of a plasma immersion process in accordance with some embodiments of the present invention. Method 600 begins at 602 where the thickness of the doped oxide layer atop the first substrate (e.g., a first doped oxide layer) is determined using the methods and apparatus described above. Next, at 604, one or more (typically a plurality) of additional substrates are processed in the first plasma immersion chamber. For example, the additional substrates may be production substrates.

After a desired number of additional substrates are processed, a doped oxide layer of a second substrate may be analyzed and compared to the doped oxide layer of the first substrate. For example, at 606, a second substrate comprising an oxide layer deposited atop a silicon layer is subjected to the plasma immersion process in the first plasma immersion chamber to form a doped oxide layer atop the second substrate (e.g., a second doped oxide layer). In some embodiments, the second substrate may be substantially identical to the first substrate, e.g., comprised of the same materials as described above with respect to the first substrate. In some embodiments, the formation of the oxide layer and the doped oxide layer atop the second substrate is performed in the manner described above with respect to the first substrate.

Next, at 608, the thickness of the doped oxide layer atop the second substrate may be determined using the same procedure as described above for determining the thickness of the doped oxide layer atop the first substrate. At 610, the thickness of the doped oxide layers atop the first and second substrates are compared to determine an amount of process drift, if any, exists in the first plasma immersion chamber.

In some embodiments, substrates may be processed in a first plasma immersion chamber and in a second plasma immersion chamber. Thickness and uniformity values of doped oxide layers on substrates processed in the different chambers can then be analyzed and used to evaluate and compare different process chambers to each other or to a common reference chamber (e.g., chamber matching).

Figure 7:
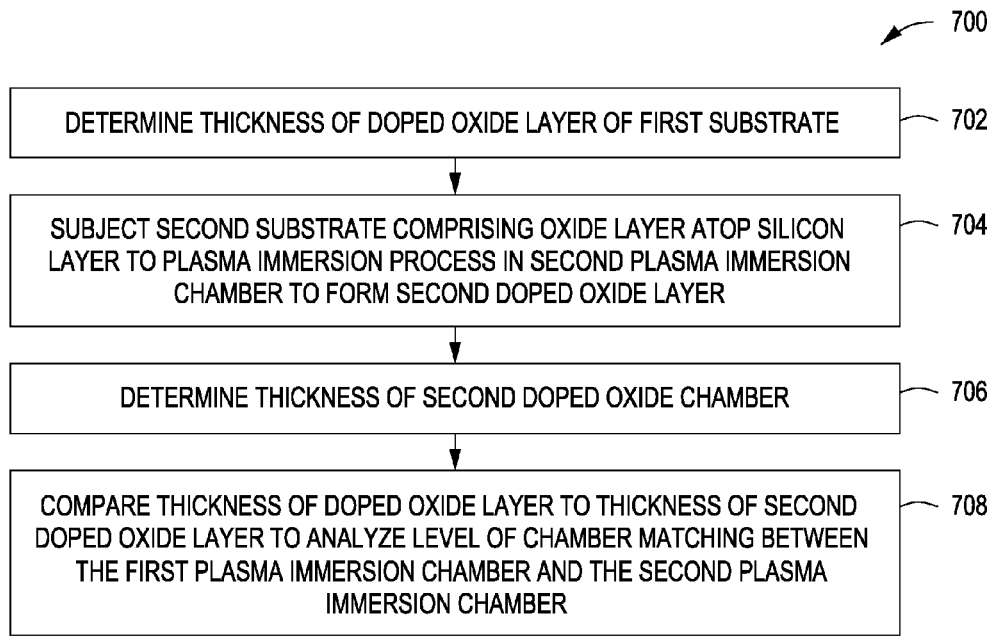
FIG. 7 depicts a flow chart for a method of quantitatively measuring the performance of a plasma immersion process in accordance with some embodiments of the present invention.

For example, FIG. 7 depicts a flow chart for a method of quantitatively measuring the performance of a plasma immersion process in accordance with some embodiments of the present invention. Method 700 begins at 702 where the thickness of the doped oxide layer atop the first substrate is determined, for example, using the methods and apparatus described above. At 704, a second substrate comprising an oxide layer disposed atop a silicon layer is subjected to a plasma immersion process in a second plasma immersion chamber to form a doped oxide layer atop the second substrate. At 706, the thickness of the doped oxide layer atop the second substrate is measured, for example, using the techniques described above. Next, at 708, the thickness of the doped oxide layer atop the first substrate and the thickness of the doped oxide layer atop the second substrate are compared in order to determine differences in performance between the first plasma immersion chamber and second plasma immersion chamber (e.g., the level of chamber matching may be analyzed and determined).

Although described as matching two chambers, the above method could be used to match multiple chambers to each other, or to a reference chamber. For example, in some embodiments, a third substrate comprising an oxide layer deposited atop a silicon layer may be subjected to a third plasma immersion process in a third plasma immersion chamber to form a third doped oxide layer atop the third substrate. The thickness of the third doped oxide layer may be determined as described above by analyzing light reflected off of a surface of the third substrate. The thicknesses of the first and third doped oxide layers may be compared to determine a level of chamber matching between the first and third plasma immersion chambers.

Figure 4:
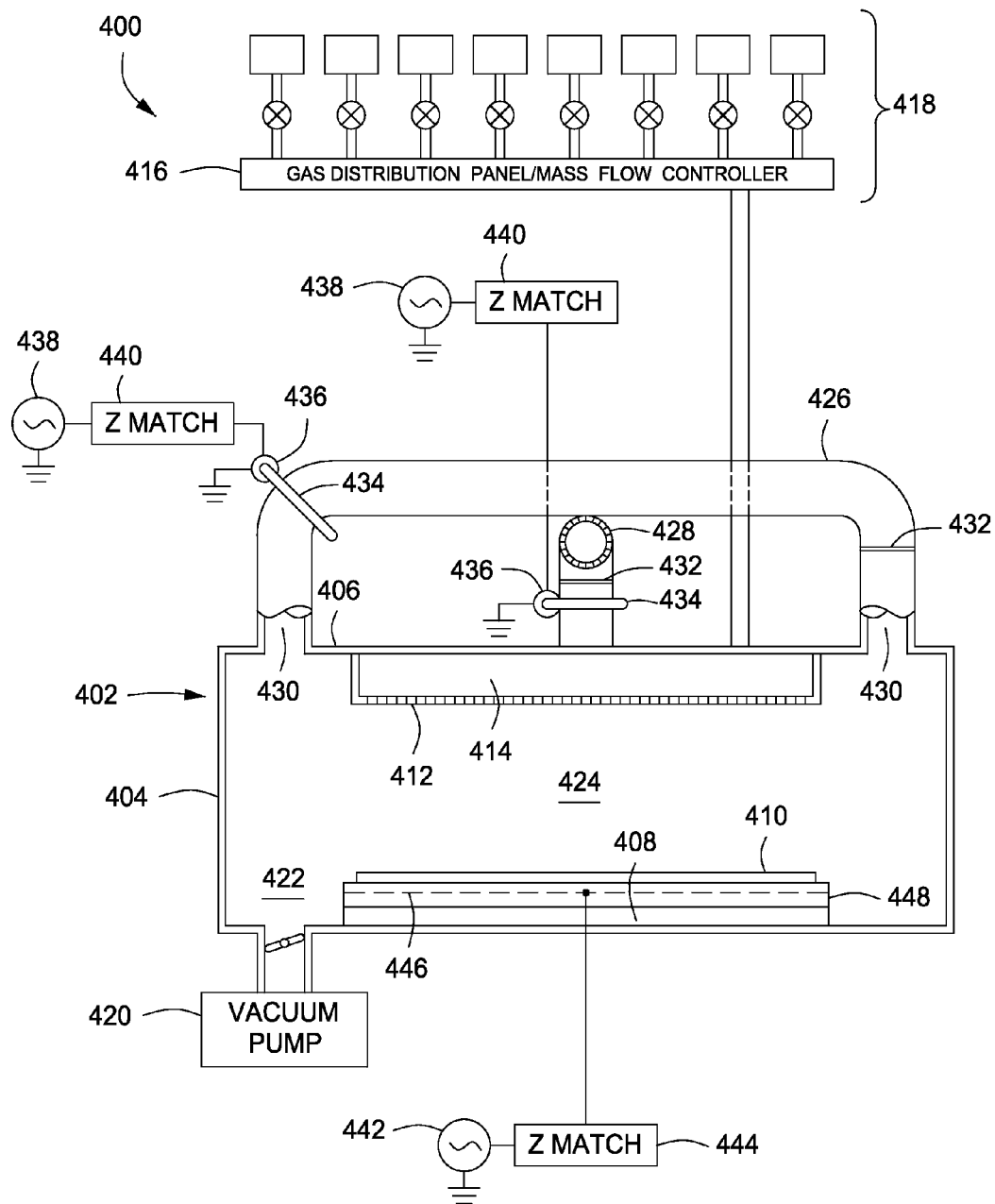
FIG. 4 depicts a plasma immersion ion implantation process chamber in accordance with some embodiments of the present invention.

Referring to FIG. 4, a toroidal source plasma immersion ion implantation ("P3i") reactor 400 has a cylindrical vacuum chamber 402 defined by a cylindrical side wall 404 and a disk-shaped ceiling 406. A substrate support pedestal 408 at the floor of the chamber supports a substrate 410 to be processed. A gas distribution plate or showerhead 412 on the ceiling 406 receives process gas in its gas manifold 414 from a gas distribution panel 416 whose gas output can be any one of or mixtures of gases from one or more individual gas supplies 418. A vacuum pump 420 is coupled to a pumping annulus 422 defined between the substrate support pedestal 408 and the sidewall 404. A process region 424 is defined between the substrate 410 and the gas distribution plate 412.

A pair of external reentrant conduits 426, 428 establishes reentrant toroidal paths for plasma currents passing through the process region, the toroidal paths intersecting in the process region 424. Each of the conduits 426, 428 has a pair of ends 430 coupled to opposite sides of the chamber. Each conduit 426, 428 is a hollow conductive tube. Each conduit 426, 428 has a D.C. insulation ring 432 preventing the formation of a closed loop conductive path between the two ends of the conduit.

An annular portion of each conduit 426, 428, is surrounded by an annular magnetic core 434. An excitation coil 436 surrounding the core 434 is coupled to an RF power source 438 through an impedance match device 440. The two RF power sources 438 coupled to respective ones of the cores 434 may be of two slightly different frequencies. The RF power coupled from the RF power generators 438 produces plasma ion currents in closed toroidal paths extending through the respective conduit 426, 428 and through the process region 424. These ion currents oscillate at the frequency of the respective RF power source 438. Bias power is applied to the substrate support pedestal 408 by a bias power generator 442 through an impedance match circuit 444.

Plasma formation and subsequent oxide layer formation is performed by introducing a process gas, or mixture of process gases into the chamber 424 through the gas distribution plate 412 and applying sufficient source power from the generators 438 to the reentrant conduits 426, 428 to create toroidal plasma currents in the conduits and in the process region 424. The plasma flux proximate the wafer surface is determined by the wafer bias voltage applied by the RF bias power generator 442. The plasma rate or flux (number of ions sampling the wafer surface per square cm per second) is determined by the plasma density, which is controlled by the level of RF power applied by the RF source power generators 438. The cumulative ion dose (ions/square cm) at the wafer 410 is determined by both the flux and the total time over which the flux is maintained.

If the wafer support pedestal 408 is an electrostatic chuck, then a buried electrode 446 is provided within an insulating plate 448 of the wafer support pedestal, and the buried electrode 446 is coupled to the bias power generator 442 through the impedance match circuit 444.

In operation, and for example, the formation of a doped oxide layer on the substrate 410 is achieved by placing the substrate 410 on the substrate support pedestal 408, introducing one or more process gases into the chamber 402 and striking a plasma from the process gases. Plasma may be generated from the process gases within the reactor 400 to assist in the plasma immersion process to form the doped oxide layer on the substrate 410. The plasma is formed in the process region 424 by applying sufficient source power from the generators 438 to the reentrant conduits 426, 428 to create plasma ion currents in the conduits 426, 428 and in the process region 424 in accordance with the process described above. In some embodiments, the wafer bias voltage delivered by the RF bias power generator 442 can be adjusted to control the flux of ions to the wafer surface. In some embodiments, no bias power is applied.

While the foregoing is directed to embodiments of the present invention, other and further embodiments of the invention may be devised without departing from the basic scope thereof.

The invention claimed is:

1. A method of quantitatively measuring the performance of a plasma immersion process using a first substrate comprising an oxide layer deposited atop a silicon layer, the method comprising:
    subjecting the first substrate to a plasma immersion process in a first plasma immersion chamber to form a doped oxide layer atop the first substrate; and
    determining a thickness of the doped oxide layer by:
        shining a beam of light upon a reflective surface of the doped oxide layer;
        detecting reflected beams of light off of the reflective surface of the doped oxide layer; and
        analyzing the reflected beams of light to determine the thickness of the doped oxide layer on the first substrate.

2. The method of claim 1, wherein analyzing the reflected beam of light off of the reflective surface of the first substrate further comprises monitoring for a shift in surface reflection indicative of the thickness of the reflective surface of the first substrate.

3. The method of claim 1, further comprising:
    processing a plurality of additional substrates in the first plasma immersion chamber;
    subjecting a second substrate comprising an oxide layer deposited atop a silicon layer to the plasma immersion process in the first plasma immersion chamber to form a doped oxide layer atop the second substrate;
    determining a thickness of the doped oxide layer atop the second substrate; and
    comparing the thickness of the doped oxide layer atop the first substrate to the thickness of the doped oxide layer atop the second substrate to determine a process drift in the first plasma immersion chamber.

4. The method of claim 1, further comprising
    subjecting a second substrate comprising an oxide layer deposited atop a silicon layer to a plasma immersion process in a second plasma immersion chamber to form a doped oxide layer atop the second substrate;
    determining a thickness of the doped oxide layer atop the second substrate; and
    comparing the thickness of the doped oxide layer atop the first substrate to the thickness of the doped oxide layer atop the second substrate to analyze a level of chamber matching between the first plasma immersion chamber and the second plasma immersion chamber.

5. The method of claim 1, further comprising removing the first substrate from the first plasma immersion chamber into a chamber configured to analyze reflected beams of light in order to determine the thickness of the doped oxide layer atop the first substrate.

6. The method of claim 1, further comprising determining a thickness of the oxide layer atop the first substrate by:
    shining a beam of light upon a partially reflective surface of the doped oxide layer;
    detecting beams of light that pass through the partially reflective surface of the doped oxide layer and reflect off a reflective surface of the oxide layer; and
    analyzing the reflected beams of light to determine the thickness of the oxide layer on the first substrate.

7. The method of claim 1, wherein subjecting the first substrate to the plasma immersion process in the first plasma immersion chamber to form the doped oxide layer atop the first substrate forms the doped oxide layer atop the first substrate to a thickness that is less than the thickness of the oxide layer.

8. The method of claim 7, wherein the oxide layer consists essentially of silicon and oxygen.

9. The method of claim 8, wherein the doped oxide layer comprises SiOCH.

10. The method of claim 1, wherein, subjecting the first substrate to the plasma immersion process in the first plasma immersion chamber to form the doped oxide layer atop the first substrate forms the doped oxide layer to a thickness that is greater than the initial thickness of the oxide layer.

11. The method of claim 10, wherein subjecting the first substrate to the plasma immersion process in the first plasma immersion chamber to form the doped oxide layer causes a layer comprising SICH to be formed beneath the oxide layer.

12. The method of claim 11, wherein the doped oxide layer comprises SiOCH.

13. A method of quantitatively measuring the performance of a plasma immersion process, comprising:
    subjecting a first substrate comprising an oxide layer deposited atop a silicon layer to a first plasma immersion process to form a first doped oxide layer atop the first substrate;

determining a thickness of the first doped oxide layer by analyzing light reflected off of a surface of the first substrate;

subjecting a second substrate comprising an oxide layer deposited atop a silicon layer to a second plasma immersion process to form a second doped oxide layer atop the second substrate;

determining a thickness of the second doped oxide layer by analyzing light reflected off of a surface of the first substrate; and comparing the thicknesses of the first and second doped oxide layers to compare the results of the first and second plasma immersion processes.

14. The method of claim 13, further comprising:

performing the first and second plasma immersion processes in a first plasma immersion chamber;

processing one or more additional substrates in the first plasma immersion chamber between performing the first and second plasma immersion processes; and comparing the thicknesses of the first and second doped oxide layers to determine an amount of process drift of the first plasma immersion chamber.

15. The method of claim 13, further comprising:

performing the first plasma immersion process in a first plasma immersion chamber;

performing the second plasma immersion process in a second plasma immersion chamber; and comparing the thicknesses of the first and second doped oxide layers to determine a level of chamber matching between the first and second plasma immersion chambers.

16. The method of claim 15, further comprising:

subjecting a third substrate comprising an oxide layer deposited atop a silicon layer to a third plasma immersion process in a third plasma immersion chamber to form a third doped oxide layer atop the third substrate;

determining a thickness of the third doped oxide layer by analyzing light reflected off of a surface of the third substrate; and comparing the thicknesses of the first and third doped oxide layers to determine a level of chamber matching between the first and third plasma immersion chambers.

17. The method of claim 13, wherein determining the thickness of the first doped oxide layer and the second doped oxide layer is performed in a different chamber than a chamber or chambers in which the first and second plasma immersion processes are carried out.

18. A method of quantitatively measuring the performance of a plasma immersion process, comprising:

determining a thickness of a first doped oxide layer of a first substrate subjected to a first plasma immersion process that formed the first doped oxide layer atop the first substrate by analyzing light reflected off of a surface of the first substrate;

determining a thickness of a second doped oxide layer of a second substrate subjected to a second plasma immersion process that formed the second doped oxide layer atop the second substrate by analyzing light reflected off of a surface of the second substrate; and comparing the thicknesses of the first and second doped oxide layers to compare the results of the first and second plasma immersion processes.

* * * * *